(12) United States Patent
Otsubo et al.

(10) Patent No.: US 11,419,215 B2
(45) Date of Patent: Aug. 16, 2022

(54) MODULE

(71) Applicant: Murata Manufacturing Co., Ltd., Kyoto (JP)

(72) Inventors: Yoshihito Otsubo, Kyoto (JP); Kyo Shin, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/146,857

(22) Filed: Jan. 12, 2021

(65) Prior Publication Data

US 2021/0136917 A1 May 6, 2021

Related U.S. Application Data

(63) Continuation of application No. PCT/JP2019/028239, filed on Jul. 18, 2019.

(30) Foreign Application Priority Data

Jul. 20, 2018 (JP) .............................. JP2018-137139

(51) Int. Cl.
*H05K 1/18* (2006.01)
*H01L 23/367* (2006.01)
(Continued)

(52) U.S. Cl.
CPC ........... *H05K 1/181* (2013.01); *H01L 23/367* (2013.01); *H01L 23/552* (2013.01); *H01L 24/16* (2013.01);
(Continued)

(58) Field of Classification Search
CPC .. H05K 1/181; H05K 7/20509; H01L 23/367; H01L 23/552
(Continued)

(56) References Cited

U.S. PATENT DOCUMENTS 5,737,833 A    4/1998 Motomura et al.
2009/0133900 A1*  5/2009 Nishikawa ................ C09J 9/02
                                                                  174/250
(Continued)

FOREIGN PATENT DOCUMENTS

JP    H08-37254 A    2/1996
JP    H08-111583 A   4/1996
(Continued)

OTHER PUBLICATIONS

International Search Report issued in Application No. PCT/JP2019/028239, dated Sep. 10, 2019.
(Continued)

*Primary Examiner* — Sherman Ng
(74) *Attorney, Agent, or Firm* — Pearne & Gordon LLP

(57) ABSTRACT

A module includes a wiring board having a first main surface, a first component mounted on the first main surface and having a first height H1, a second component mounted on the first main surface and having a second height H2 lower than the first height H1, and a sealing resin arranged so as to cover the first component and the second component while covering the first main surface. Compared to a first connection terminal used for connection between the first component and the first main surface, a second connection terminal used for connection between the second component and the first main surface has a higher height. A surface of the first component on a side far from the first main surface and a surface of the second component on a side far from the first main surface are exposed from the sealing resin.

8 Claims, 8 Drawing Sheets

(51) Int. Cl.
*H01L 23/552* (2006.01)
*H01L 23/00* (2006.01)
*H01L 25/16* (2006.01)
*H05K 7/20* (2006.01)

(52) U.S. Cl.
CPC ......... *H01L 25/16* (2013.01); *H05K 7/20509* (2013.01); *H01L 2224/1601* (2013.01); *H01L 2224/16227* (2013.01); *H01L 2924/18161* (2013.01); *H01L 2924/19041* (2013.01); *H01L 2924/19042* (2013.01); *H01L 2924/19043* (2013.01); *H01L 2924/19103* (2013.01); *H01L 2924/19105* (2013.01); *H01L 2924/19106* (2013.01); *H05K 2201/0715* (2013.01); *H05K 2201/10522* (2013.01); *H05K 2201/10674* (2013.01); *H05K 2201/10977* (2013.01)

(58) Field of Classification Search
USPC ....................................................... 361/715
See application file for complete search history.

(56) References Cited

U.S. PATENT DOCUMENTS

| | | | |
|---|---|---|---|
| 2014/0204550 A1* | 7/2014 | Kataoka | H05K 1/0216 361/765 |
| 2015/0054178 A1 | 2/2015 | Ishii et al. | |
| 2015/0179621 A1* | 6/2015 | Matsumoto | H01L 23/49811 257/737 |
| 2017/0345736 A1 | 11/2017 | Miyairi | |
| 2019/0273312 A1 | 9/2019 | Otsubo | |
| 2020/0321261 A1 | 10/2020 | Fujino et al. | |

FOREIGN PATENT DOCUMENTS

| | | |
|---|---|---|
| JP | 2001307948 A | 11/2001 |
| JP | 2005203633 A | 7/2005 |
| JP | 2007188934 A | 7/2007 |
| JP | 2011159930 A | 8/2011 |
| JP | 2015-041760 A | 3/2015 |
| JP | 2015-195319 A | 11/2015 |
| JP | 2017085064 A | 5/2017 |
| JP | 2017212376 A | 11/2017 |
| WO | 2018101384 A1 | 6/2018 |
| WO | 2019124024 A1 | 6/2019 |

OTHER PUBLICATIONS

Written Opinion issued in Application No. PCT/JP2019/028239, dated Sep. 10, 2019.

* cited by examiner

MODULE

CROSS REFERENCE TO RELATED APPLICATIONS

This is a continuation of International Application No. PCT/JP2019/028239 filed on Jul. 18, 2019 which claims priority from Japanese Patent Application No. 2018-137139 filed on Jul. 20, 2018. The contents of these applications are incorporated herein by reference in their entireties.

BACKGROUND OF THE DISCLOSURE

Field of the Disclosure

The present disclosure relates to a module.

Description of the Related Art

Japanese Patent Application Laid-Open No. 2011-159930 (Patent Document 1) describes an electronic device including a printed circuit board on which a plurality of electronic components having different mounting heights are mounted, a heat sink plate, and a mold resin. Thermally conductive bumps arranged in a compressed state thermally couple the plurality of electronic components with the heat sink plate.
Patent Document 1: Japanese Patent Application Laid-Open No. 2011-159930

BRIEF SUMMARY OF THE DISCLOSURE

In the configuration described in Patent Document 1, the electronic components having different heights have different distances to the heat sink plate, and thus the thermally conductive bumps connected to the respective electronic components have different heights. When having large heights, the thermally conductive bumps have long heat dissipation paths, and thus the heat dissipation from the electronic components to the heat sink plate deteriorates. Therefore, there are differences in the heat dissipation depending on the heights of the electronic components.

Accordingly, an object of the present disclosure is to provide a module that is less likely to have a difference in the heat dissipation in every component.

In order to achieve the above object, a module based on the present disclosure includes a wiring board having a first main surface, a first component mounted on the first main surface and having a first height, a second component mounted on the first main surface and having a second height lower than the first height, and a sealing resin arranged so as to cover the first component and the second component while covering the first main surface. Compared to a first connection terminal used for connection between the first component and the first main surface, a second connection terminal used for connection between the second component and the first main surface has a higher height. A surface of the first component on a side far from the first main surface and a surface of the second component on a side far from the first main surface are exposed from the sealing resin.

According to the present disclosure, a first component and a second component can dissipate the heat equally and efficiently even though heights of components themselves are different, so that it is possible to make a module that is less likely to have a difference in heat dissipation in every component. Further, because both the first component and the second component are exposed from the sealing resin, the heat dissipation can be improved as compared with a structure in which heat is dissipated by using thermally conductive bumps.

DETAILED DESCRIPTION OF THE DISCLOSURE

Figure 1:
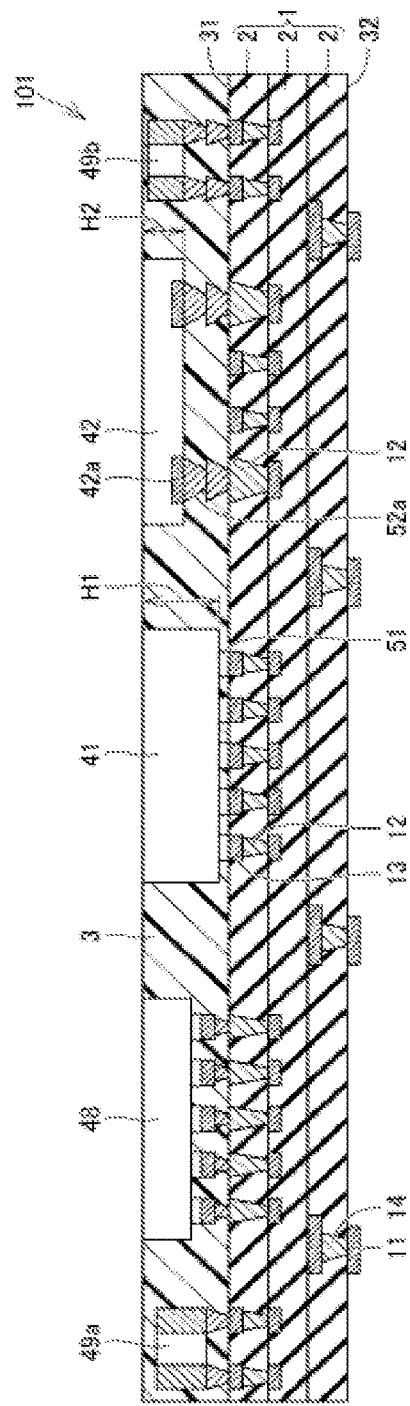
FIG. 1 is a sectional view of a module in a first embodiment based on the present disclosure.

The dimensional ratios illustrated in the drawings do not always faithfully represent the actual dimensions, and the dimensional ratios may be exaggerated for convenience of description. In the following description, when referring to the concept of above or below, it does not necessarily mean absolute above or below, but may mean relative above or below in an illustrated posture.

First Embodiment

A module in a first embodiment based on the present disclosure will be described with reference to FIG. 1. The module referred to here may be one called a component built-in module.

As illustrated in FIG. 1, a module 101 includes a wiring board 1 having a first main surface 31, a first component 41, a second component 42, and a sealing resin 3. The first component 41 is mounted on the first main surface 31 and has a first height H1. The second component 42 is mounted on the first main surface 31 and has a second height H2 that is lower than the first height. The sealing resin 3 is arranged so as to cover the first component 41 and the second component 42 while covering the first main surface 31. Although it is described here as "to cover", the sealing resin 3 does not fully cover the first component 41 and the second component 42, and as will be described later, on both of the first component 41 and the second component 42, a part of the surface is exposed from the sealing resin 3. Then, compared to a first connection terminal 51 used for connection between the first component 41 and the first main surface 31, a second connection terminal 52a used for connection between the second component 42 and the first main surface 31 has a higher height. A surface of the first component 41 on the side far from the first main surface 31 and a surface of the second component 42 on the side far from the first main surface 31 are exposed from the sealing resin 3.

The wiring board 1 may be a resin substrate or a ceramic substrate. The wiring board 1 may also be one called a core board. The wiring board 1 may be a stack of a plurality of insulating layers 2 as illustrated in FIG. 1. The insulating layer 2 may be a resin layer or a ceramic layer.

In the example illustrated here, the wiring board 1 has a second main surface 32 as a surface opposite to the first main surface 31. An external connection electrode 11 is arranged on the second main surface 32. The external connection electrode 11 is electrically connected to a conductor via 14 penetrating the insulating layer 2.

A connection electrode 13 is arranged on the first main surface 31 of the wiring board 1. Moreover, the first connection terminal 51 for connecting the electronic component 41 and the connection electrode 13 is arranged. In the example illustrated here, the first connection terminal 51 is solder. The first connection terminal 51 may be any conductor other than solder. The first connection terminal 51 may be formed as, for example, a single conductor extending in a thickness direction. The first connection terminal 51 may be, for example, a solder bump.

Below the first component 41, a conductor via 12 is arranged so as to electrically connect to the connection electrode 13. The conductor via 12 is arranged so as to penetrate the insulating layer 2. As illustrated below the second component 42, the conductor via 12 may be directly exposed to the first main surface 31. The second component 42 has an electrode 42a. The second connection terminal 52a electrically connects the electrode 42a and the conductor via 12. In the example illustrated here, the second connection terminal 52a is formed by stacking two conductor vias in the thickness direction, but the second connection terminal may be formed as a single conductor extending in the thickness direction. The second connection terminal 52a may also be one formed by stacking three or more conductor vias in the thickness direction.

Here, because the height of the second connection terminal 52a is more than the height of the first connection terminal 51, an upper surface of the first component 41 and an upper surface of the second component 42 have the same heights. That is, the upper surface of the first component 41 and the upper surface of the second component 42 are located in the same plane. It is not necessary that the upper surface of the first component 41 and the upper surface of the second component 42 are at the same height, and the both may be at different heights, but also in that case, both the upper surface of the first component 41 and the upper surface of the second component 42 are exposed from the sealing resin 3. Here, because the description has been given using the example in which the first component 41 and the second component 42 are located on an upper side of the wiring board 1, the description has been given focusing on the positions of the upper surfaces of both the components, but the locations of the first component 41 and the second component 42 are not limited to the upper side of the wiring board 1, and may be on the lower side. In that case, a similar point can be said about the positions of the lower surfaces of both the components.

A component other than the first component 41 and the second component 42 may be mounted on the first main surface 31. In the example illustrated in FIG. 1, a component 48 is also mounted on the first main surface 31. Chip components 49a, 49b are also mounted on the first main surface 31. It is preferable that an upper surface of the component 48 be exposed from the sealing resin 3. It is preferable that the upper surface of the component 48 be located in the same plane as the upper surface of the first component 41 and the upper surface of the second component 42.

In the example illustrated here, the first component 41 and the second component 42 are ICs. The component 48 is also an IC. The chip components 49a, 49b may be capacitors, for example. Here, it is assumed that the chip components 49a, 49b are capacitors, but types of chip components are not limited to this. The chip components may be, for example, inductors or resistors. In addition to the chip components 49a, 49b, or instead of the chip components 49a, 49b, other types of components may be mounted.

In the present embodiment, because the surface of the first component 41 on a side far from the first main surface 31 and the surface of the second component 42 on a side far from the first main surface 31 are exposed from the sealing resin 3, the heat generated by the first component 41 and the heat generated by the second component 42 can be released to the outside without being hindered by the sealing resin 3. Therefore, the first component 41 and the second component 42 can dissipate the heat equally and efficiently even though the heights of the components themselves are different. Therefore, it is possible to make a module that is less likely to have a difference in heat dissipation in every component.

Second Embodiment

Figure 2:
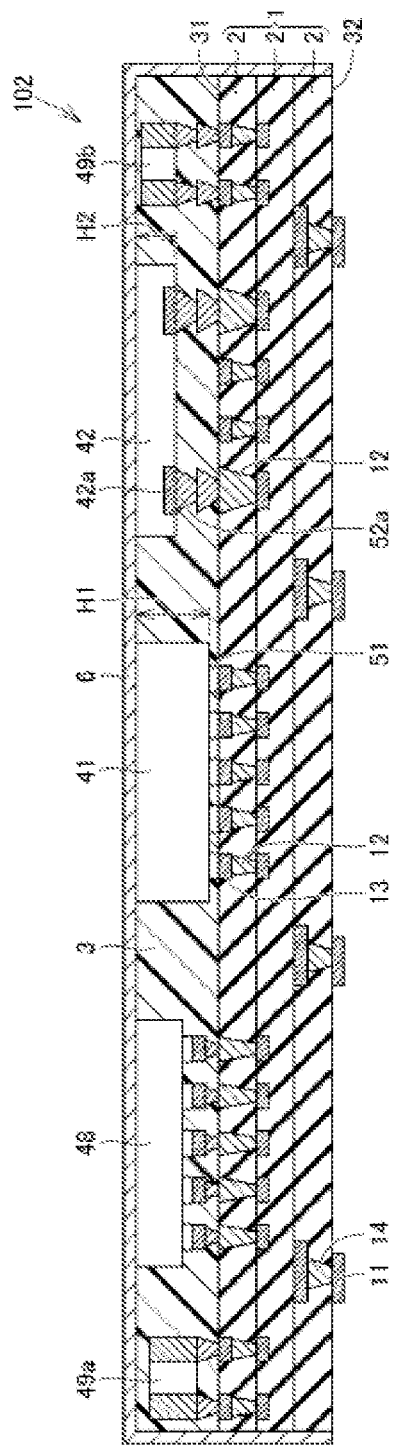
FIG. 2 is a sectional view of a module in a second embodiment based on the present disclosure.

A module in a second embodiment based on the present disclosure will be described with reference to FIG. 2. A module 102 in the present embodiment has a basic configuration similar to that of the module 101 described in the first embodiment. On the other hand, the module 102 differs from the module 101 in the following points.

The module 102 includes a first component 41, a second component 42, and a shield film 6 arranged so as to cover the sealing resin 3. In the module 102, the first component 41 and the second component 42 are in contact with the shield film 6. The shield film 6 may be, for example, a metal film. It is preferable that the shield film 6 also cover a side surface of the wiring board 1.

In the example illustrated here, the first component 41 and the second component 42 are in surface contact with the shield film 6. In the example illustrated in FIG. 2, a component 48 is also in contact with the shield film 6. The component 48 is also in surface contact with the shield film 6.

In the present embodiment, because the shield film 6 is provided, electromagnetic waves emitted from the first component 41 or the second component 42 can be shielded, and electromagnetic influence on the outside can be prevented. Alternatively, it is possible to prevent external electromagnetic waves from affecting the first component 41 or the second component 42. Further, the shield film 6 can be formed of a material having excellent thermal conductivity such as metal. In the present embodiment, because the first component 41 and the second component 42 are in contact with the shield film 6, the heat generated in the first component 41 and the second component 42 can be efficiently released with the shield film 6 interposed therebetween. Therefore, it is possible to achieve a module having excellent heat dissipation.

It is preferable that the first component 41 and the second component 42 be in surface contact with the shield film 6 because heat can be dissipated more efficiently.

Third Embodiment

Figure 3:
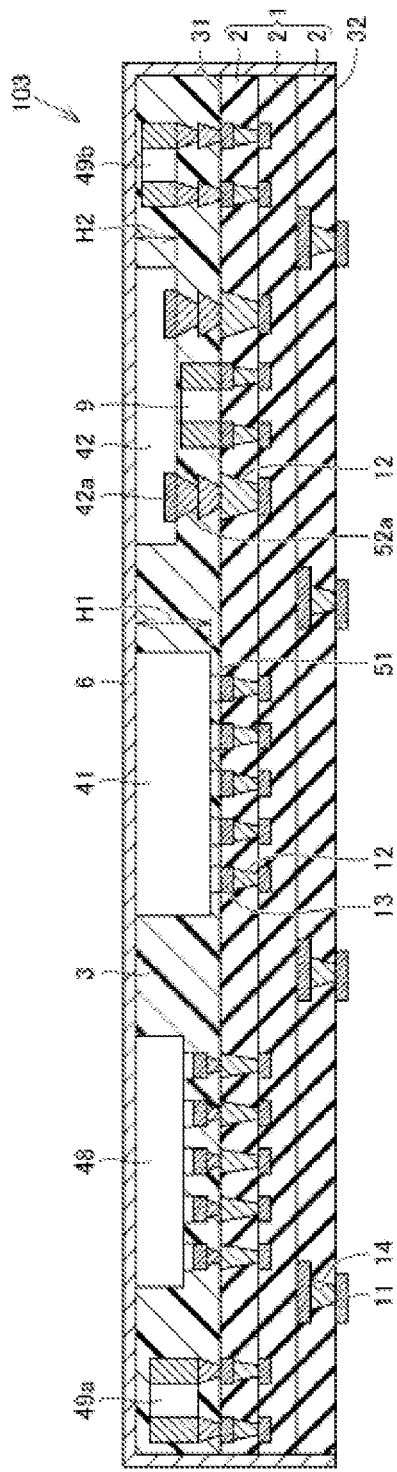
FIG. 3 is a sectional view of a module in a third embodiment based on the present disclosure.

A module in a third embodiment based on the present disclosure will be described with reference to FIG. 3. A module 103 in the present embodiment has a basic configuration similar to that of the module 102 described in the second embodiment. On the other hand, the module 103 differs from the module 102 in the following points.

The module 103 includes another component 9 mounted on the first main surface 31 between the second component 42 and the first main surface 31. The component 9 may be, for example, a chip component. The height of the component 9 is less than the height of the second connection terminal 52a. There may be a gap between an upper surface of the component 9 and a lower surface of the second component 42.

In the present embodiment, because the other component 9 mounted on the first main surface 31 is provided between the second component 42 and the first main surface 31, the second component 42 and the other component 9 are arranged so as to overlap in the thickness direction. By arranging them at overlapping positions in this manner, it contributes to mounting more components in a limited area. In the present embodiment, space saving can be achieved.

Note that, here, the configuration in which the component 9 is added to the module 102 described in the second embodiment has been described as the module 103, but the configuration in which the component 9 is added to the module 101 described in the first embodiment is also conceivable.

Fourth Embodiment

Figure 4:
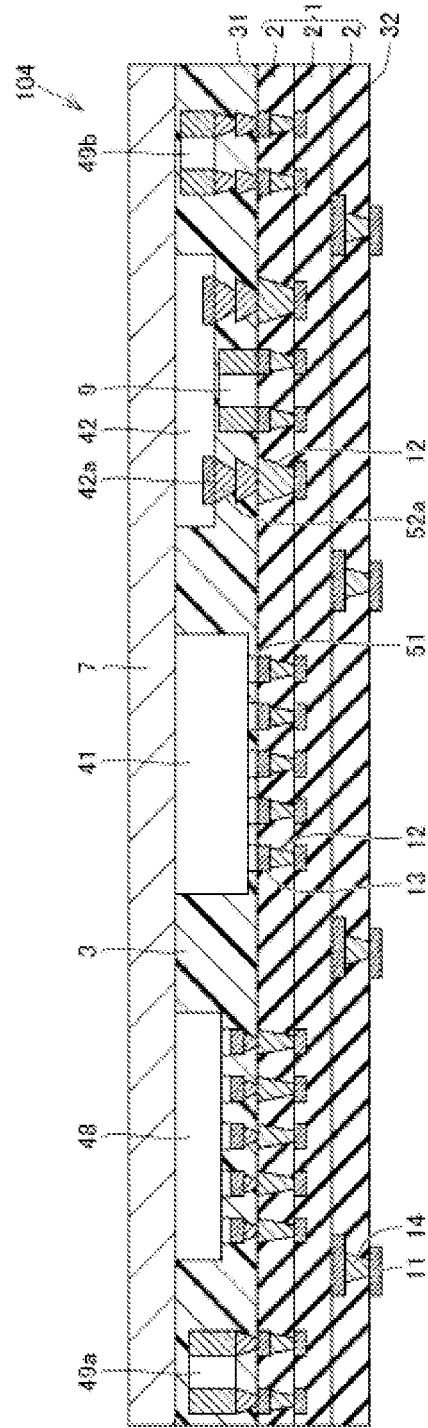
FIG. 4 is a sectional view of a module in a fourth embodiment based on the present disclosure.

A module in a fourth embodiment based on the present disclosure will be described with reference to FIG. 4. A module 104 in the present embodiment has a basic configuration similar to that of the module 101 described in the first embodiment. On the other hand, the module 104 differs from the module 101 in the following points.

The module 104 includes a heat sink plate 7. The first component 41 and the second component 42 are in contact with the heat sink plate 7. The heat sink plate 7 may be, for example, a metal plate. The heat sink plate 7 is only required to be formed by a material having higher thermal conductivity than the sealing resin 3. In the example illustrated in FIG. 4, the component 48 is also in contact with the heat sink plate 7.

In the example illustrated here, the first component 41 and the second component 42 are in surface contact with the heat sink plate 7.

In the present embodiment, because the first component 41 and the second component 42 are in contact with the heat sink plate 7, the heat generated by the first component 41 and the second component 42 can be efficiently released with the heat sink plate 7 interposed therebetween. Here, although an example in which the heat sink plate 7 is a flat plate has been illustrated, the heat sink plate 7 is not limited to a flat plate-shaped member and may have a different shape. For example, the heat sink plate 7 may include heat radiating fins.

Fifth Embodiment

Figure 5:
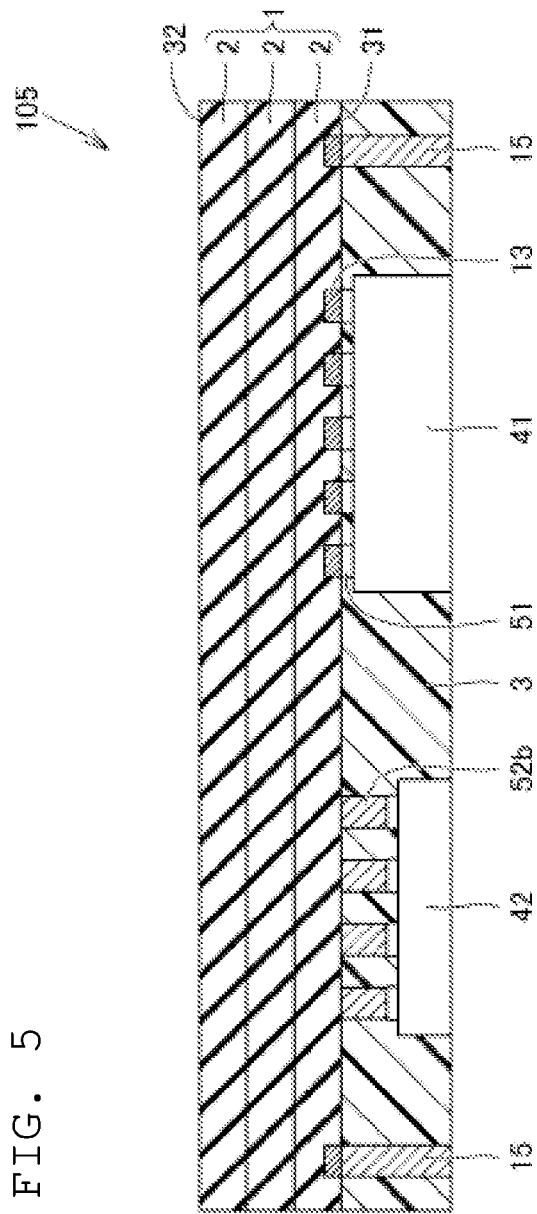
FIG. 5 is a sectional view of a module in a fifth embodiment based on the present disclosure.

A module in a fifth embodiment based on the present disclosure will be described with reference to FIG. 5. A module 105 in the present embodiment has a basic configuration similar to that of the module 101 described in the first embodiment, but is upside down as compared with the module 101. As illustrated in FIG. 5, in the module 105, a lower surface of a wiring board 1 is a first main surface 31 and an upper surface of the wiring board 1 is a second main surface 32. The module 105 includes a connection conductor 15. The connection conductor 15 is electrically connected to an electrode formed on the first main surface 31 and penetrates the sealing resin 3. The connection conductor 15 is a rod-shaped conductor. The connection conductor 15 may be a metal pin. The connection conductor 15 may be a stack of a plurality of conductor vias. A second component 42 is mounted on the first main surface 31 and is electrically connected to the connection electrode provided on the first main surface 31 by a second connection terminal 52b. The second connection terminal 52b may be any of plating, solder bumps, stripe bumps, pillar bumps, or the like.

Figure 6:
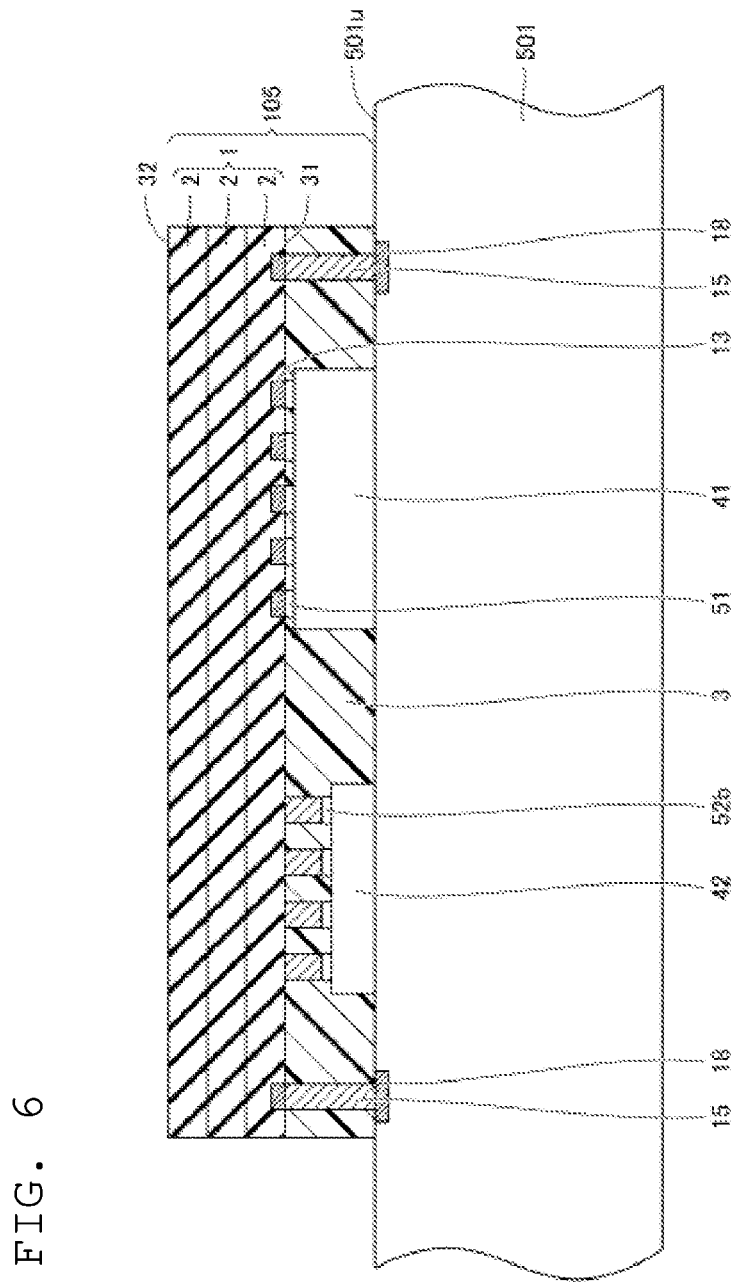
FIG. 6 is a sectional view of a module mounted on another member in the fifth embodiment based on the present disclosure.

FIG. 6 illustrates the module 105 mounted on a surface 501u of a member 501. The first main surface 31 is a surface facing the other member 501 when the module 105 is mounted on the other member 501. The member 501 may be, for example, a mother substrate.

In the present embodiment, a surface of a first component 41 on a side far from the first main surface 31 and a surface of the second component 42 on a side far from the first main surface 31 are exposed from the sealing resin 3, and the first main surface 31 is a surface facing the other member 501 when the module 105 is mounted on the other member 501. Thus, the surfaces of the first component 41 and the second component 42 exposed from the sealing resin 3 can abut, or at least approach even if they do not abut, the surface 501u of the member 501. Therefore, the heat generated in each of the first component 41 and the second component 42 can be dissipated through the member 501. Therefore, the first component 41 and the second component 42 can dissipate the heat equally and efficiently even though the heights of the components themselves are different. Therefore, it is possible to make a module that is less likely to have a difference in heat dissipation in every component.

In order to dissipate the heat efficiently, it is preferable that the first component 41 and the second component 42 be in contact with the member 501. It is more preferable that the first component 41 and the second component 42 be in surface contact with the member 501.

Sixth Embodiment

Figure 7:
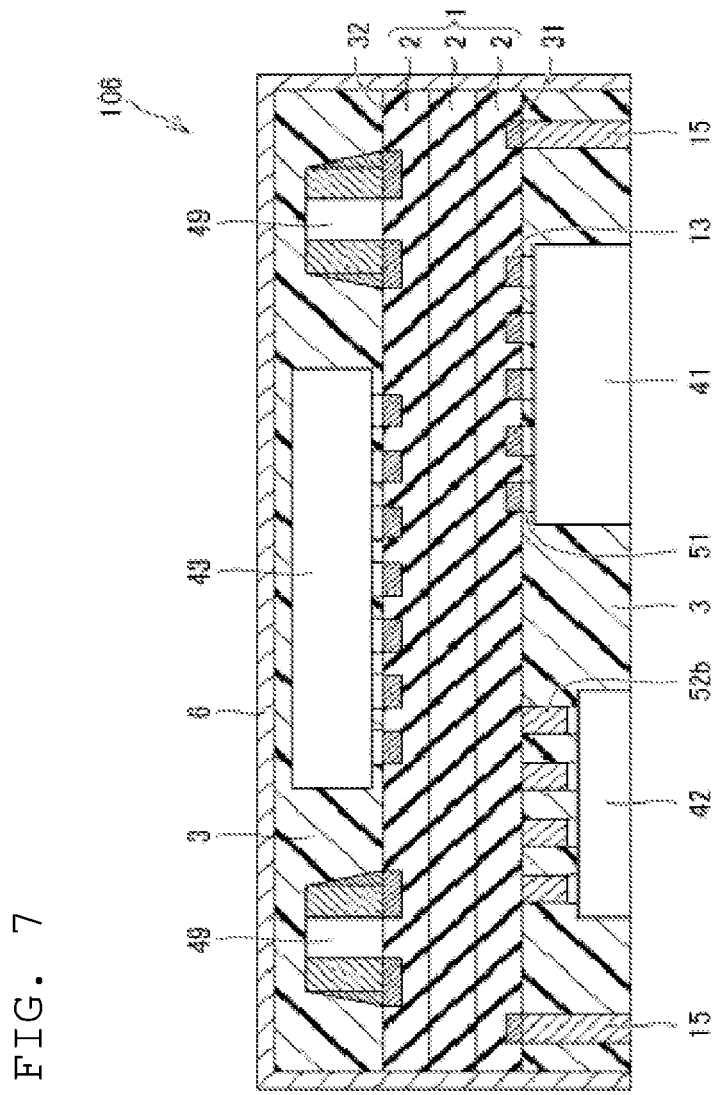
FIG. 7 is a sectional view of a module in a sixth embodiment based on the present disclosure.

A module in a sixth embodiment based on the present disclosure will be described with reference to FIG. 7. A module 106 in the present embodiment has a basic configuration similar to that of the module 105 described in the fifth embodiment, but differs from the module 105 in the following points.

In the module 106, the wiring board 1 has a second main surface 32 on an opposite side of a first main surface 31, and a third component 43 is mounted on the second main surface 32. The third component 43 may be, for example, an IC. Further, a surface of the third component 43 on a side far from the second main surface 32 may be exposed from the sealing resin 3. In that case, the third component 43 is in surface contact with the shield film 6, and thus the heat generated by the third component 43 can be efficiently released. In the module 106, not only a side of the first main surface 31 but also a side of the second main surface 32 are covered with the sealing resin 3. In addition to the third component 43, a plurality of chip components 49 is mounted on the second main surface 32. This is just an example, and in reality, the components mounted on the second main surface 32 may be ICs, chip components, or other types of components, and the number thereof may be any number.

The shield film 6 is formed so as to cover the surfaces other than a lower surface of the module 106. All the components mounted on the second main surface 32 are covered with the sealing resin 3, and the sealing resin 3 is further covered with the shield film 6. The shield film 6 not only covers the sealing resin 3, but also covers a side surface of the wiring board 1, and further covers a side surface of the sealing resin 3 arranged on the first main surface 31.

Also, in the present embodiment, effects similar to those described in the fifth embodiment can be obtained. Further, in the present embodiment, because the components are mounted not only on the first main surface 31 of the wiring board 1 but also on the second main surface 32, it can be a configuration such that more components are mounted in a limited area.

Here, an example including the shield film 6 is illustrated, but a configuration without the shield film 6 may be used. The range in which the shield film 6 is formed is not limited to that illustrated in FIG. 7.

Seventh Embodiment

Figure 8:
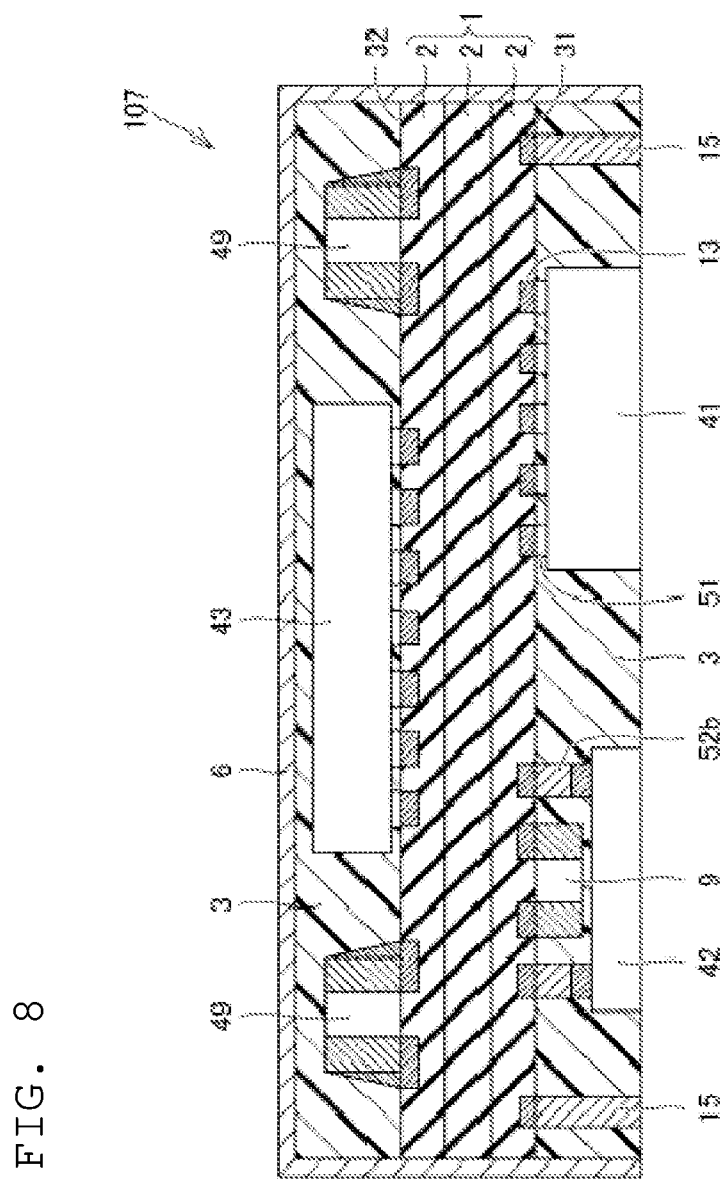
FIG. 8 is a sectional view of a module in a seventh embodiment based on the present disclosure.

A module in a seventh embodiment based on the present disclosure will be described with reference to FIG. 8. A module 107 in the present embodiment has a basic configuration similar to that of the module 106 described in the sixth embodiment, but differs from the module 106 in the following points.

The module 107 includes another component 9 mounted on the first main surface 31 between the second component 42 and the first main surface 31. The component 9 may be, for example, a chip component. The height of the component 9 is less than the height of the second connection terminal 52a. There may be a gap between a lower surface of the component 9 and the upper surface of the second component 42.

Also, in the present embodiment, effects similar to those described in the sixth embodiment can be obtained. Further, in the present embodiment, because the other component 9 mounted on the first main surface 31 is provided between the second component 42 and the first main surface 31, the second component 42 and the other component 9 are arranged so as to overlap in the thickness direction. By arranging them at overlapping positions in this manner, effects similar to those described in the third embodiment can be obtained.

Note that a plurality of the above-described embodiments may be appropriately combined and employed.

Note that the above-described embodiments disclosed at this time are examples in all respects and are not restrictive. The scope of the present disclosure is indicated by the claims and includes all modifications within the meaning and scope equivalent to the claims.

1: Wiring board
2: Insulating layer
3: Sealing resin
6: Shield film
7: Heat sink plate
8: Member
9: Component
11: External connection electrode
12, 14: Conductor via
13: Connection electrode
15: Connection conductor
18: Connection terminal
31: First main surface
32: Second main surface
41: First component
42: Second component
42a: Electrode
48: Component
49, 49a, 49b: Chip component
51: First connection terminal
52a, 52b: Second connection terminal
101, 102, 103, 104, 105, 106, 107: Module
501: Member
501u: Surface

The invention claimed is:

1. A module comprising: a wiring board having a first main surface; a first component mounted on the first main surface and having a first height; a second component mounted on the first main surface and having a second height lower than the first height; a sealing resin arranged so as to cover the first component and the second component while covering the first main surface, wherein compared to a first connection terminal used for connection between the first component and the first main surface, a second connection terminal used for connection between the second component and the first main surface has a higher height, and a surface of the first component on a side far from the first main surface and a surface of the second component on a side far from the first main surface are exposed from the sealing resin; and a shield film arranged so as to cover the first component, the second component, and the sealing resin, wherein the first component and the second component are in contact with the shield film.

2. The module according to claim 1, further comprising a heat sink plate, wherein the first component and the second component are in contact with the heat sink plate.

3. The module according to claim 1, wherein the first main surface is a surface opposing another member when the module is mounted on the other member.

4. The module according to claim 3, wherein the wiring board has a second main surface on an opposite side of the first main surface, and a third component is mounted on the second main surface.

5. The module according to claim 1, further comprising another component mounted on the first main surface between the second component and the first main surface.

6. The module according to claim 2, further comprising another component mounted on the first main surface between the second component and the first main surface.

7. The module according to claim 3, further comprising another component mounted on the first main surface between the second component and the first main surface.

8. The module according to claim 4, further comprising another component mounted on the first main surface between the second component and the first main surface.

* * * * *